United States Patent [19]
Slocum et al.

[11] Patent Number: 5,915,678
[45] Date of Patent: Jun. 29, 1999

[54] KINEMATIC COUPLING SYSTEM FOR THIN PLATES AND SHEETS AND THE LIKE

[75] Inventors: Alexander H. Slocum, Bow, N.H.; Daniel Braunstein, Somerville, Mass.

[73] Assignee: Aesop, Inc., Concord, N.H.

[21] Appl. No.: 08/655,456

[22] Filed: May 30, 1996

[51] Int. Cl.⁶ .................................................. B23Q 1/00
[52] U.S. Cl. ........................... 269/47; 269/305; 269/903; 29/281.1
[58] Field of Search ................................ 29/281.5, 281.1; 269/47, 50, 51, 52, 76, 903, 900, 296–298, 305; 211/41, 87, 14; 248/488–490

[56] References Cited

U.S. PATENT DOCUMENTS

| | | | |
|---|---|---|---|
| 2,995,357 | 8/1961 | Dennis et al. | 269/51 |
| 4,875,966 | 10/1989 | Perko | 269/903 |
| 5,566,840 | 10/1996 | Waldner et al. | 269/47 |

*Primary Examiner*—Robert C. Watson
*Attorney, Agent, or Firm*—Rines and Rines

[57] ABSTRACT

A novel system for kinematically positioning planar surfaces such as printed circuit board components and elements of material, where one element has precisely formed and positioned (e.g., punched) slots that fit loosely over three corresponding posts, such that when a bias force, such as gravity from a tilted plane or a combing action, or expanding bladder on the posts, is applied, the surfaces are referenced to one side of the slots to in effect form a planar kinematic coupling so the relative planar position and orientation is defined with great accuracy and repeatability; such also allowing an entire factory system to be built where each piece of precision manufacturing equipment can use this planar kinematic coupling to achieve great accuracy in the manufacture of printed circuit boards or the like to allow for the use of ever smaller electronics components.

6 Claims, 4 Drawing Sheets

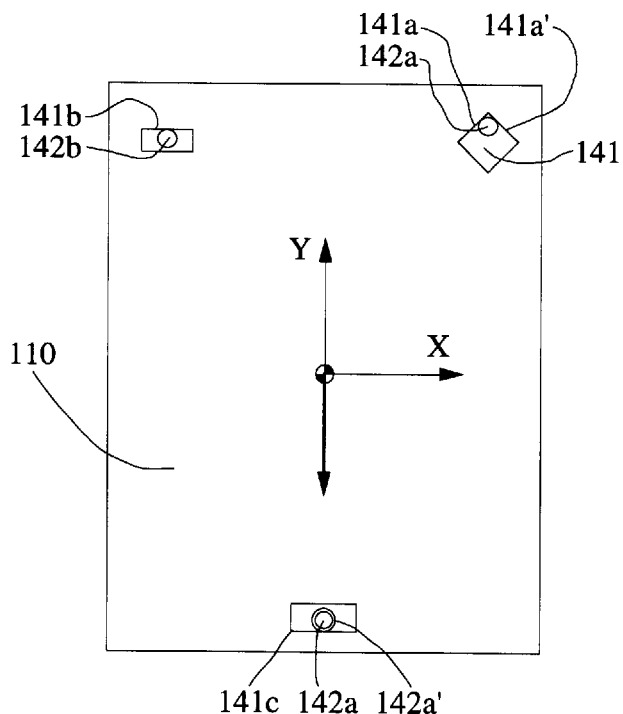
Fig. 7
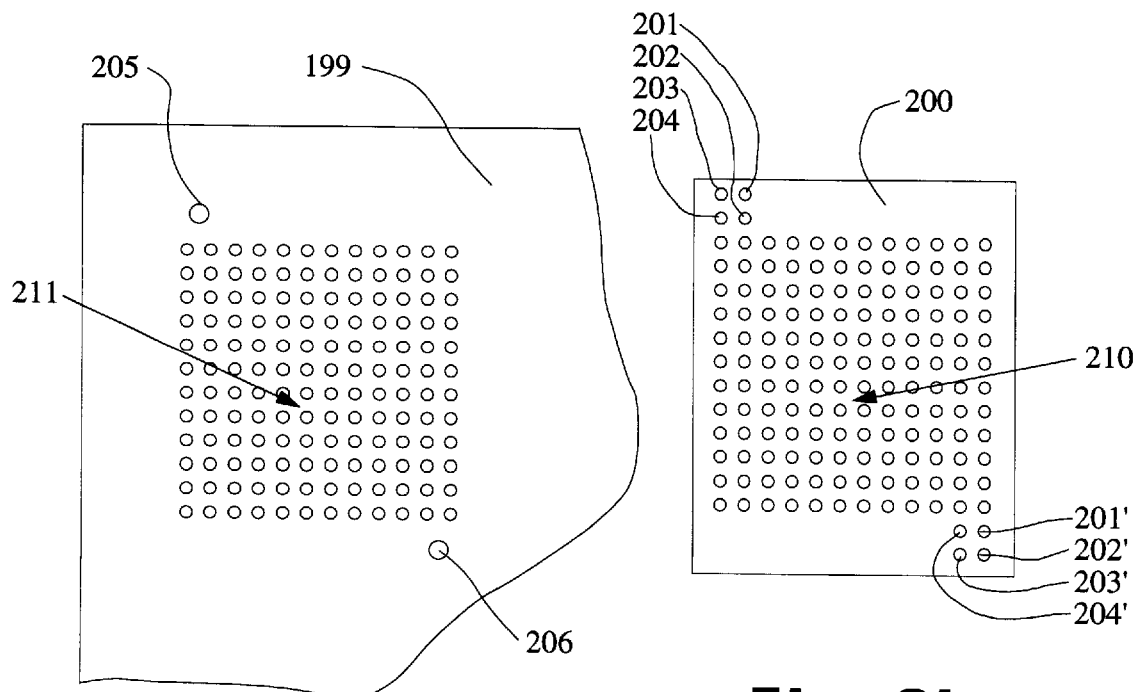
Fig. 8a
Fig. 8b

KINEMATIC COUPLING SYSTEM FOR THIN PLATES AND SHEETS AND THE LIKE

The present invention relates to methods of and systems for kinematically positioning layered surfaces such as plates or sheets of planar material, being particularly, though not exclusively, directed to laying up thin sheets in printed circuit board manufacturing and the like, such that the relative position and orientation of the sheets is defined with great accuracy and repeatability.

BACKGROUND

Printed circuit boards (PCB) are the common denominator in virtually all electronics products and the circuit board manufacturing industry is huge. It is often seen as "low tech", because the manufacture of circuit boards has generally been accomplished with rather simple tools; but, with the growing push towards miniaturization, line widths and pad sizes are decreasing, with the result that current manufacturing techniques are struggling to maintain alignment between layers in a circuit board. The problem arises with the fact that circuit boards are made from many thin layers which each have unique circuit patterns, and which must align so that interconnection holes (passages) can be formed between them. These thin sheets are like large pieces of paper and are typically large fiberglass sheets coated with copper which is then covered with photoresist, exposed, and then etched. They are exceedingly difficult to position repeatably. Typically, overconstrained arrangements of slots and holes are used to fit over close tolerance posts. Currently, the industry standard is to use precision-punched holes in sheets and precision alignment posts, which, due to tooling errors and environmental issues, result in positioning errors on the order of hundreds of microns. For very thin flexible sheets conventional fixturing methods are not applicable. The first problem of tooling errors-tolerances between the slot size and the post size, and errors in their relative positions and orientations; and the second problem of post wear residing in the use of fiberglass which is super abrasive, result in a practical positioning repeatability of only about 100 to 200 microns. Furthermore, dimensions of punched holes and slots vary with material thickness due to the mechanics of the glass-epoxy material that forms the very struicture of the circuit board.

Other industries, such as the aircraft industry, also have similar positioning problems with large material sheets. These same issues apply, although on a larger scale. The fixturing method that is the subject of this invention is equally applicable to such and similar applications, as well, and is being described illustratively for the example of printed circuit boards.

A key to the design philosophy that guides the use of this invention in all its different applications is the recognition that the loading is succinctly different from that in a traditional kinematic coupling. Accordingly, it is appropriate to review the mathematical background to the technology—an area called screw theory. Screw theory asserts that the motion of any system can be represented by a combination of a finite number of screws of varying pitch that are connected in a particular manner. This concept is well illustrated for a plethora of mechanisms by Phillips (J. Phillips, *Freedom in Machinery*, Vol. I, Cambridge University Press, London, 1982, p 90.). Earlier work on screws spanned the latter half of the 19th century, and a detailed summary of such work on screw theory was published in 1900 (R. S. Ball, *A Treatise on the Theory of Screws*, Cambridge University Press, London, 1900). Ball's treatise describes the theory of screws in elegant, yet easily comprehensible linguistic and mathematical terms.

Screw theory is an elegant and powerful tool for analyzing the motion of rigid bodies in contact, but it is not always easy to apply. With respect to practical implementation of the theoretical requirement for stability, for traditional precision three-groove kinematic couplings, such as described by applicant Slocum (A. Slocum, Precision Machine Design, Prentice Hall, 1991, Section 7.7), stability, and good overall stiffness will be obtained if the normals to the plane of the contact force vectors bisect the angles of the triangle formed by the hemispheres (e.g., balls) that lie in the grooves.

This works well for kinematic coupling of one rigid body to the next. When one wants to use a kinematic coupling to define the position and orientation (yaw) of a body in a plane, and then have the body translate down and contact a plane, however, one needs to use a translational kinematic coupling as described in applicant's co-pending U.S. patent application Ser. No. 568,612 (Dec. 7, 1995).

For thinner sections, it is possible to cut grooves in the body, if the grooves can still be made to have sufficient rigidity to support contact on angled force lines. This works for applications such as silicon wafers as disclosed in, for example, applicant's co-pending U.S. patent application Ser. No. 324,255 (Oct. 17, 1994). Current state of the art, however, uses non-kinematic solutions involving use of a post that fits tightly in a hole to form a pivot point, and then a post that fits tightly in a groove to form a reaction point, where the tight fit in the hole of the first pin is supposed to provide planar registration. The problem is that these accurate fits are very hard to realize in practice with great accuracy and repeatability.

There remains, however, a powerful need for means to align precisely different layers in a printed circuit board lay-up prior to heating and pressing the layers to bond them together, as well as at every step in the process that creates the layers in the first place. The issue is that the sheets that make up the PCB layers are very thin and floppy. They are typically made of fiberglass sheets on the order of a fraction of a millimeter in thickness. In addition to not being able to support any normal forces (to the plane of the sheet) it is not possible to form shaped grooves in the sheet. It is only practical to cut slots into the sheets, where the cut is straight through the sheet.

In the reprographics industry, when a large stack of paper is to have its edges aligned, such as prior to binding, the paper is put into a vibrator with walls on 2 sides at a compound angle. This shakes all the sheets down into a common corner. Such a technique is not practical for PCB sheets, however, because the sheets are so difficult to cut that sub-millimeter registration would never be achievable, though it would be possible to precision-punch registration grooves into the sheets.

Thus a special design has been needed to develop kinematic couplings specifically tailored for application to the problems of accurately positioning and orienting thin sheets of materials.

OBJECTS OF THE INVENTION

An object of the present invention, accordingly, is to provide a new and improved method of and systems for kinematically positioning and orienting planar surfaces such as sheets of materials.

A further object is to provide such a technique in which kinematic preloading and holding in place of a stack of thin sheets of material is enabled.

Another object of the invention is to optimize the selection of the best orientation of slots to be cut into the sheet, relative to the direction which gravity would load the sheet when it is positioned on an inclined plane with posts or pegs, each post smaller than each of the respective slots and engaging the slots to form a kinematic (deterministic) fixturing system to define the position of the sheet with respect to the posts with a very high degree of repeatability.

Other and further objects will be explained hereinafter and are more fully delineated in the appended claims.

SUMMARY

In summary, the invention embraces a system for kinematically positioning planar surfaces such as sheets having, in combination, a planar mount for resting the surfaces thereupon; each surface having a plurality of openings spaced along and near edges thereof; the planar mount being provided with a plurality of protrusions corresponding, located and spaced similarly to the openings and of less cross-dimension than that between the walls bounding the openings, such that, as the surface is mounted on the planar mount, the protrusions thereof are loosely received within the corresponding surface openings; the mounted surface being subjected to an applied preload force having a component along the plane of the surface to cause the protrusions to engage and contact points of the walls of the corresponding openings, uniquely to define the planar position and orientation of the surface upon the mount.

With this system and method, thin sheets of material can be positioned kinematically, such as for laying up sheets in printed circuit board manufacturing, where each sheet has three precisely formed and positioned (e.g., punched) slots that fit loosely over three corresponding cylindrically shaped posts, such that when a bias force, such as gravity from a tilted plane or a coming action, or expanding bladder on the posts, is applied, the sheets are referenced against one side of the slots to effect a planar kinematic coupling with the relative planar position and orientation of the sheets defined with great accuracy and repeatability. An entire factory system. indeed, can use this concept, where each piece of precision manufacturing equipment employs such planar kinematic coupling to achieve great accuracy in the manufacture of printed circuit boards (or the like) to allow for the use of ever smaller electronics components.

Preferred and best mode designs and techniques are hereinafter detailed.

DRAWINGS

The invention will now be described with reference to the accompanying drawing in which.

Figure 6A:
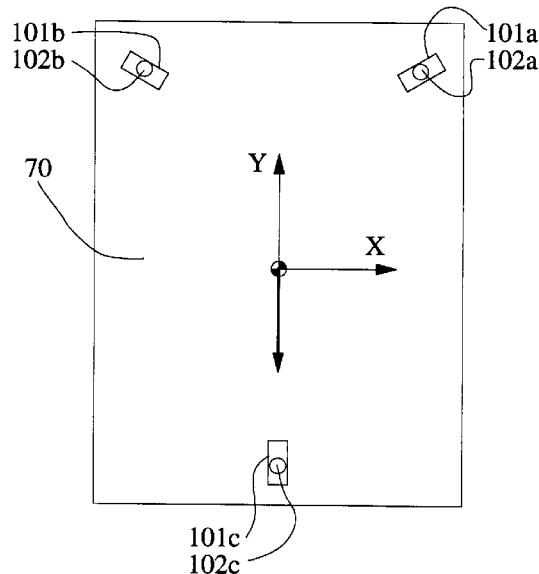
Figure 6B:
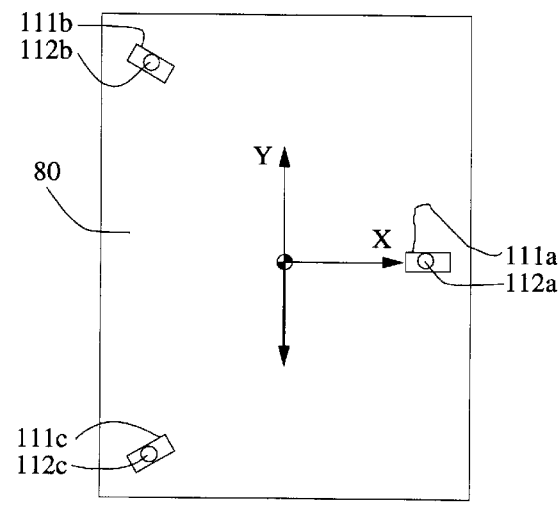
Figure 6C:
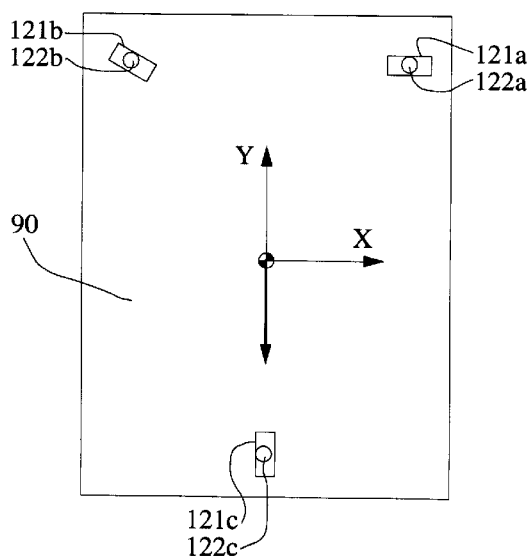
Figure 6D:
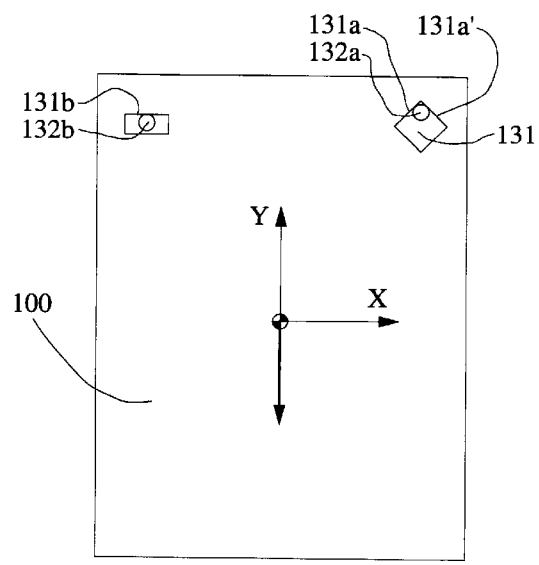

FIGS. 6a, 6b, 6c, and 6d are plan views that show a progression of components with kinematic coupling slots and preload force vectors in order of increasing self-centering action;

FIG. 7 is a plan view that shows the component of FIG. 6d provided with an added preload slot and actuatable preload post at the bottom of the sheet; and FIGS. 8a and 8b are a close-up plan view of an application of the invention to an electronics package with a ball-grid-array of contacts, and special ball-grid kinematic features to align chips to contacts on the printed circuit board, where once again, the key is to use kinematic mounts to align the flat plane surfaces together.

PREFERRED EMBODIMENT(S) OF THE INVENTION

Figure 1:
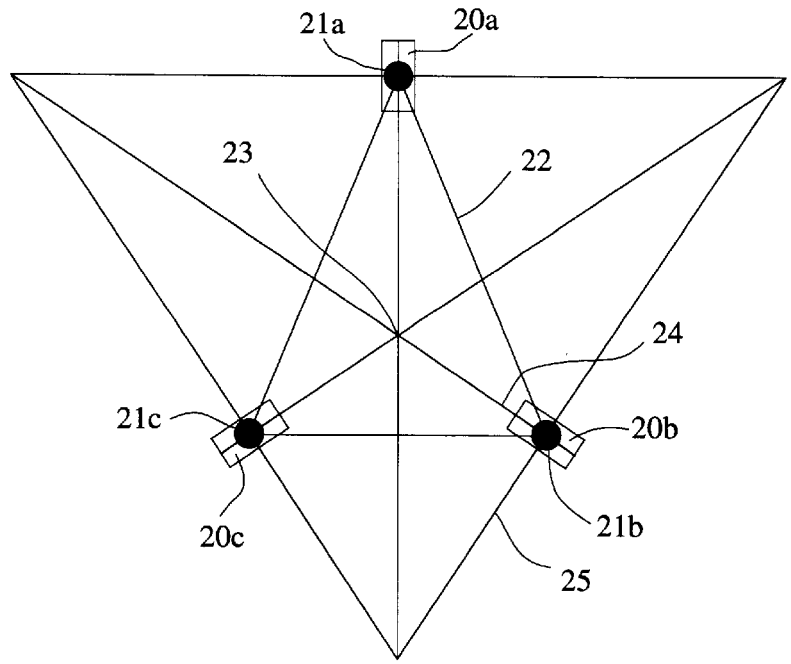
FIG. 1 is a schematic view of a traditional prior art kinematic coupling and the graphical methods used to optimize groove orientation.

FIG. 1 is a diagram of prior art kinematic couplings where one object or body containing 3 vee-grooves 20a, 20b, and 20c mates with corresponding balls 21a, 21b, and 21c of another object or body to be coupled to the first. When each ball mates within each respective groove, two points of contact occur which uniquely define the position of the one body with respect to the other (six points of contact define six degrees of freedom). In order to obtain approximately equal stiffness in all directions, one must properly orient the grooves with respect to one other in accordance with the following rules. First, to achieve stability, the planes that pass through the contact points must form a closed triangle such as 25. Next, the optimal shape of the triangle should be such that the normals to the sides of the triangles (the groove axes), such as 24, should bisect the angle of the opposed angle. The result is that the normals will all meet at the coupling centroid 23 of the triangle 22 formed by the coupling balls 21a, 21b, and 21c.

While the above sets out the geometrical requirements for kinematic coupling generally, there are significant practical problems, as before described, in precisely aligning different planar-surface layers in a printed circuit board lay-up, for example prior to heating and pressing the layers to bond them together, as well as at every step in the process of creating the layers in the first place. The issue is that the sheets that make up the PCB layers are very thin and floppy—typically of fiberglass sheets on the order of a fraction of a millimeter in thickness. In addition to not being able to support any normal forces (to the plane of the sheet), it is not even possible to form shaped grooves in the sheet; it being only practical to cut slots or other notches into the sheets, where the cut is straight through the sheet.

Figure 2:
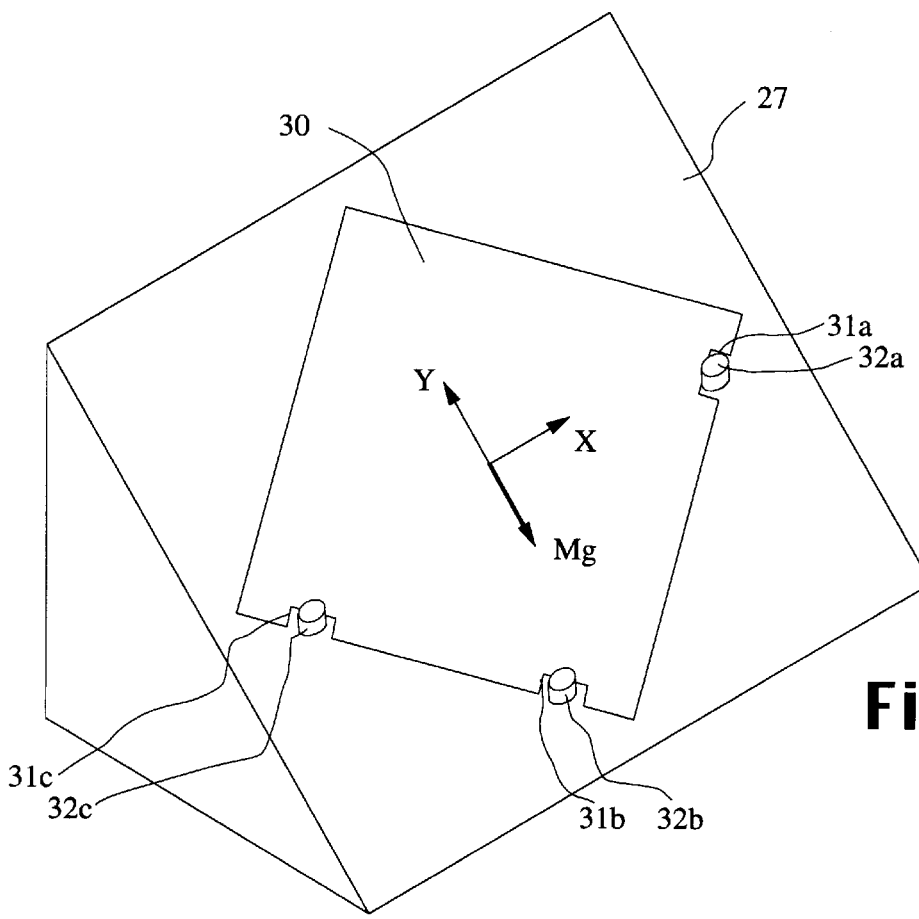
FIG. 2 is an isometric view 6f a sheet of material precisely located by having three precision punched slots spaced along the edges of a sheet, preferably mounted on an inclined plane to provide a gravity pre-load or bearing force that enables engagement with three corresponding precisely located posts on a plane.

FIG. 2 shows such a sheet 30 with rectangular notches or slots 31a, 31b, and 31c cut in the sides of the planar sheet. These notches can rest against precisely located corresponding round protrusions or posts 32a, 32b, and 32c of lesser cross dimensions, on an inclined planar mounting or support surface 27, allowing for precision registration of the sheet 30. In this embodiment, the two open rectangular notches 31b and 31c are spaced near opposite ends of the left-bottom edge of the sheet 30, and the third notch 31a is located near the upper right corner on the right-hand inclined edge. The posts 32a, 32b and 32c are positioned on the planar surface (indicated at, say, 45°, more or less), to mount the sheet with opposing diagonal corners along the Y and X axes, respectively.

Such a precision registration, while useful for some sheet materials, may require modification for thin sheet materials that may be sensitive to thermal expansion; and, with the position defined along the edges, the thermal error motion of the critical center position of the sheet can be very large. With respect to stability, furthermore, while the sheet 30 could be kept from falling off the inclined plane by use of a vacuum chuck or the like behind the sheet, other than the preload force Mg offered by gravity, there is no way to force registration against the notches. When many layers are stacked, they are subject to pressing forces, such as when they are to be bonded together, and the sheets may slide in the X and/or Y directions with respect to one another.

Figure 3:
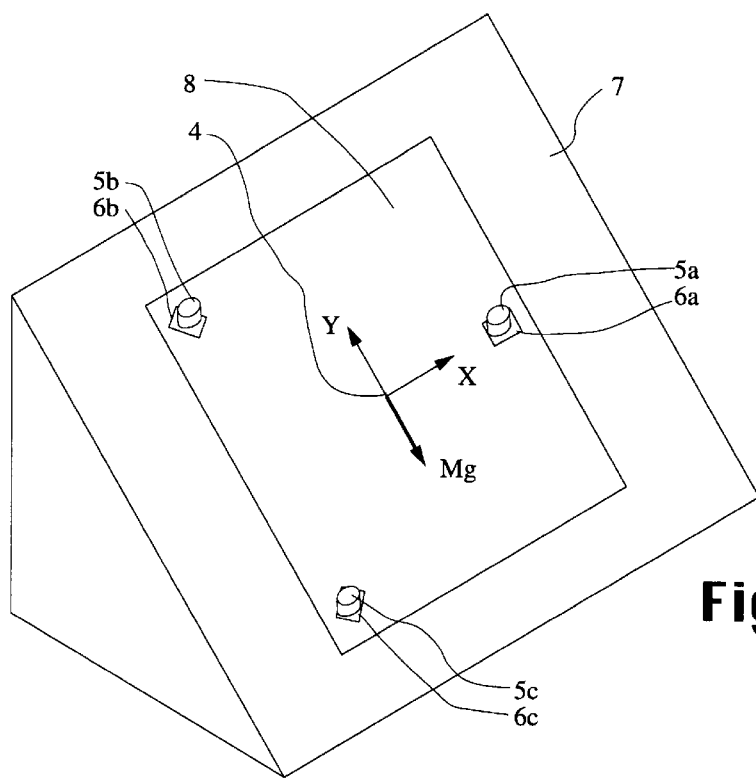
FIG. 3 is an isometric view of a sheet of material precisely located by having the three punched slots at angles in the sheet to form the basis of a planar kinematic coupling, which then engage three posts on a plane.

Another embodiment of the invention accordingly uses closed slots in the sheets to create a preloadable kinematic coupling as shown in FIG. 3, wherein the inclined plane 7 mounts a sheet 8 with its edges respectively parallel to the X and Y axes, and its rectangular or square slots 6a, 6b, and 6c receiving and engaging location and alignment posts 5a, 5b, and 5c protruding from the plane. It is important to note that because the design is deterministic (kinematic), neither the posts nor slots need be accurate in size or location in order to acheieve a high degree of repeatability. This is a major distinction over the prior art which required accurate pins and holes in order to achieve even mediocre repeatability. They only have to be accurate in size and position if location accuray is required. The slots are located and aligned with respect to one other to maximize kinematic coupling stability according to the angle bisection rules described earlier in connection with the diagram of FIG. 1. While these rules are not a condition for repeatability, they are a condition for optimizing repeatability. In the embodiment of FIG. 3, the centroid 4 is symmetrically defined with respect to the slots, and the sheet is not in the compound angle position of FIG. 2, which can be more convenient for some manufacturing applications. Note that with this type of slot orientation, with the planes through the contact points forming a closed isosceles or other triangle, thermal growth errors will radiate out from the center of the sheet, and the center of the sheet will effectively remain stationary. This means that the edges of the sheet will experience half the thermal error of a sheet constrained as shown in FIG. 2. Furthermore, this type of coupling hangs the sheet, so that it is in tension, with the lower slot primarily acting to define the angular orientation; thus a buckling/wrinkling mode is avoided which would decrease the repeatability of location of the center of the sheet.

Figure 4:
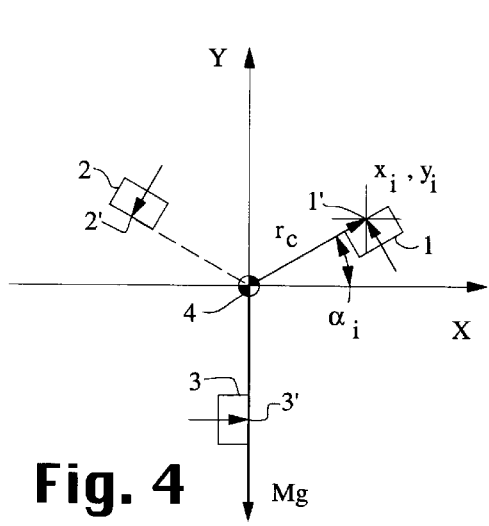
FIG. 4 is a schematic diagram of the geometry of the planar kinematic coupling which defines the convention used in the analysis.

In order to optimize the slot location and orientation, the coordinate system is modeled as in FIG. 4, where there are three generic grooves and contact points (posts, shown here as arrows) 1, 1' and 2, 2', and 3, 3', respectively. Each of these pairs has coordinates $x_i$, $y_i$ and orientation $\alpha_i$, where i=1, 2, 3, respectively. The default is that the coupling would be symmetrically located about the center of mass 4, and have a radius $r_c$. The convention for the analysis is that positive forces are oriented in a counterclockwise direction, as is the orientation angle $\alpha$.

Figures 5A, 5B:
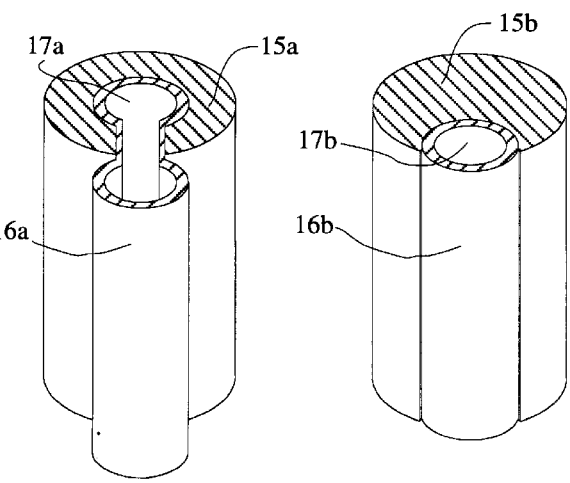
FIG. 5a is an isometric cutaway view of a precision locating post that can be used with an expandable bladder to contact the edge of a groove in a planar kinematic coupling, and with the expanding bladder acting to preload the kinematic coupling so that a stack of kinematically located sheets will not slip, such as when pressure is applied during thermal curing.
FIG. 5b is an isometric cutaway of the post in FIG. 5a, where a circular shaped bladder is used for simplicity.

When the sheets 8 of FIG. 3 are placed on the posts 5 to engage the slots 6, slight vibration will ensure that friction effects are overcome, and the sheets have settled into place. Where required, a step may be to lock them in place. To do this, a modified post 15a shown in FIG. 5a can be used. This post has a central hole and radial slot to accommodate an expanding bladder 16a, shown here as having a dumbbell shape with an inside inflatable cavity 17a to ensure it does not get pulled out when it is deflated. Many other shapes may also be used. As shown in FIG. 5b, a simple cylindrical bladder 16b with central inflatable cavity 17b, set back into the post 15b, would also work, although it would have less range of motion. An alternative to a bladder would be a sliding wedge or cam action; but, in some applications, this may be too hard for a slot in a sheet-type material.

Expanding on the issue of self-centering, it is important in the fixturing of sheets or other components, where the preload force effecting repeatable location has a component parallel to the plane against which the sheets or other components are to be fixtured or rested, that the worker or the robotic placing of the sheet or other component on the posts to engage the slots achieves a very high degree of repeatability. FIG. 6a shows a classic arrangement for such a kinematic coupling, where the sheet or other component 70 has three rectangular slots 101a, 101b, and 101c that receive and engage round posts 102a, 102b, and 103c, respectively. Slots 101a and 101b are oriented at appropriate inclined angles at left and right upper corners so that the top two slots bear the brunt of the preload force component. The third slot 101c, located mid-way of the bottom edge, counters any moment about the centroid of the sheet or other component. When the sheet or other component 70 is placed so the posts are loosely received in the slots and the preload force is applied as shown (e.g., gravity), the posts, being of smaller cross-dimension than that between the walls bounding the slots, engage only points at one side of the slots, so that the entire system is actually neutrally stable. Location repeatability, however, is not optimum.

By rotating the slots with respect to the force vector, the situation shown in FIG. 6b is obtained, where the sheet or other component 80 again has three slots 111a, 111b, and 111c that engage posts 112a, 112b, and 113c, respectively, but with the collection of slots/posts rotated 90° counterclockwise from the configuration in FIG. 6a. The result is a condition where the preload force is resisted by post-slot force components in all three slots. Thus greater repeatability is achieved. Physically, any one post acts as a pivot point.

Taking this concept of a pivot point, and trying further to maximize the forces between the posts and the slots, the configuration shown in FIG. 6c may be obtained. Here, the sheet or other component 90 has a central bottom edge vertical rectangular slot 121c, and upper right corner horizontal rectangular slot 121a, and an inclined rectangular upper left corner slot 121b, receiving and engaging posts 122c, 122a and 122b, respectively. Slot 121a engaging post 122a acts as the primary pivot point. It cannot support any load in the X direction. Slot 121b engaging post 122b minimally resists any moment about the pivot point because its force vector is substantially aligned towards post 122a. However, because slot 121a and 121b engaging posts 122a and 122b, respectively, both have substantial force vectors to resist the preload force (e.g., gravity acting on every portion of the sheet or other component), the sheet or other component hangs by these two slots. Thus, if the component is of sheet material, it would hang without buckling or wrinkling. There is still a substantial moment to be resisted, and that is countered by the action of post 122c engaging slot 121c. With the slots widely spaced from one other, the forces will preload the system, and contact stresses between posts and slots will be low to prevent such buckling; and thus, repeatability will be high. To further minimize the chance of buckling, the slot 121c can be located at the lower left corer of the sheet.

The overall philosophical goal of the invention is thus to create a pivot point, and an arrangement of slots and posts to create the maximum force between each slot and post, while hanging the sheet from two upper slots to prevent buckling and while keeping the slots as far away from each other as possible also to prevent buckling.

A condensed form is shown in FIG. 6d. Here the sheet 100 has a single larger hole 131 (such as a tilted square or diamond or a gothic arch to minimize contact stress and buckling) in one upper corner of the sheet that engages a smaller post 132a, so the fit is loose. With the use of the inclined plane of the invention to provide a preload force on the sheet, the post 132a engages two edges 131a and 131a' of the hole 131. Rotation of the sheet 100 about the post 132a is then opposed by a post 132b engaging a rectangular diagonal slot 131b located at the opposite upper corner of the sheet so the moment is maximized. The slot 131b that counters the moment could be located at the top of the sheet with an orientation angle α of 180°, so the sheet completely hangs and therefore does not buckle. Alternatively, the slot 131b could be located at the bottom of the sheet with an orientation angle α of 270°. The prime advantage of this design is that only two features need to be cut into the sheets. Note that in any hanging design, thermal growth errors will emanate from the hanging points, so the sheet center location repeatability will be affected, unless good temperature control is maintained from sheet-to-sheet.

engaging slot 142b, and a further slot 141c added at the bottom of the sheet, where an expandable post 142a, such as shown in FIGS. 5a or 5b, or a rotating cam-shaped post, or a translating post, engages the bottom side of slot 141c. In FIG. 7, the post 142a is shown provided with a rolling expandable surface 142a' to provide preload while not creating frictional tractive forces. This preloads the sheet 110 in tension and locates it kinematically so that the sheet is not required, if desired, to be located on an inclined plane. For maximized repeatability, however, the post 142a should have a rotatable outer sleeve 142a', or free linear motion parallel to the slot. The concept of not applying tractive forces between the posts and slots is applicable to any of the above configurations as a means for further reducing buckling or tractive-force-induced non-repeatable strains, all of which would reduce repeatability.

It is possible to analyze the design, and for a particular sheet or other component and loading, one can create different optimization criteria, for example, by using the SOLVER function in the Microsoft™ spreadsheet Excel™. Such a spreadsheet follows, illustrating how one skilled in the art of mechanics can optimize the groove location and orientation to maximize performance.

| Enter numbers in bold | | | | | |
|---|---|---|---|---|---|
| Weight of sheet (N) | 2.00 | | | | |
| Incline (deg) (90 is vertical) | 45.00 | | | | |
| Preload (NO), P (– indicates down) | –1.41 | | | | |
| Grooves symmetric about the CG? | yes | If "no", manually enter coordinates to the right | | | |
| Nominal coupling radius (mm) | 100.00 | | | | |
| Rotation of coupling (deg) | –30.00 | Find below using solver (positive ccw) | | | |
| Coupling Coordinate system is assumed to be located at the CG of the PCB sheet | | | | | |
| | Alpha (before rotate coupling) | Coupling grooves' coordinates | | | |
| Location of grooves wrt CS | (deg) | x (mm) | y (mm) | | |
| First groove | 0.00 | 100.00 | 0.00 | | |
| Second groove | 120.00 | –50.00 | 86.60 | | |
| Third groove | 240.00 | –50.00 | –86.60 | | |
| Equilibrium equations | | | | | |
| ΣFx = 0 | 0.00 | –0.87 | 0.87 | 0.00 F1 = | 0 |
| ΣFy = 0: | 1.00 | –0.50 | –0.50 | 1.00 F2 | 0 |
| ΣFM = 0: | 100.00 | 100.00 | 100.00 | 0.00 F3 | 0 |
| Preload from weight, incline | 0.00 | 0.00 | 0.00 | 1.00 F4 | –1.4 |
| Coupling groove forces (should be equal for a balanced design) Solver can be used to rotate the coupling until the forces are equal in magnitude | | | | | |
| F1 = | 0.94 | | | | |
| F2 = | –0.47 | | | | |
| F3 = | –0.47 | | | | |
| F4 = | –1.41 | | | | |
| Force equilization (minimize) | 0.47 | | | | |
| Coupling rotation angle to obtain even groove loading | –30.00 | | | | |

It may be desirable, furthermore, to provide an additional force to that of gravity for enhanced preload; or, if the plane must be flat, the effect of gravity must be added. This can be obtained as shown in FIG. 7, where the sheet 110 has the same geometry as the system in FIG. 6d, with post 142a engaging hole 141 at points 141a and 141a', and post 142b The physical characteristics of the coupling are entered, and then the equilibrium equations are used to balance the forces and moment on the system. A strong condition for repeatability is that each groove must bear a substantial amount of force, or else the same may risk being weakly stable, or even neutrally stable. Such would be the case, for example, if the two grooves were symmetric about the positive Y axis, and the third groove lay along the negative Y axis. To optimize the design, the spreadsheet seeks to equalize the magnitude of the forces. It does this by rotating the coupling about the centroid, to in effect rotate the sheet to virtually obtain the orientation shown in FIG. 2. Note that so long as the criteria for a closed triangle by the planes through the contact points is met, as shown in FIG. 1, the groove orientations can be changed to optimize the forces in the grooves to maximize the self-locating effect of using gravity to preload the coupling.

For example, in FIG. 3, the groove 6b has an orientation $\alpha_2$ of 120°. If the angle were 90°, the sheet tends to have better self-centering capability for some larger rectangular sheets. Through a combination of experimentation and tuning of the desired optimization criteria, one skilled in the art of kinematics can customize the design to obtain maximum repeatability for the materials to be positioned with this novel design.

Once the sheets are positioned, the expanding bladder system, shown in FIG. 5, can be used to preload the coupling, and because the slots are in effect in tension, there are no buckling issues associated with putting preload forces on a thin sheet. Once a stack of sheets is preloaded, operations such as pressing and heating can be completed without worry of sheet slippage. In fact, for single sheet processes, as in exposure tools and test tools, it may not be required to use the expanding bladder to hold position. The plane angle and gravity preload may be sufficient.

These different embodiments may each have their own application niche for different types and geometries of materials and processes. The fundamental advancement is that now as a sheet or other component is processed in a multi-step process that passes it off from machine to machine, whenever the process (such as printing or drilling) requires precision alignment with respect to the component, a very high degree of precision, on the order of microns or less, is obtained with minimal cost and effort. The exemplary illustration of the manufacture of printed circuit boards where multiple layers are made individually and then bonded together, has been described in detail above. The alignment principles of the invention, however, as before explained, are applicable to other products—for example to the direct location of silicon chips with ball-grid-array contacts directly to circuit boards since now the circuit boards can be made accurately enough to receive the chips; and the chips themselves may even have kinematic features to align them to the mounting points on the boards.

FIGS. 8a and 8b illustrate the use of the kinematic concepts described above for locating other types of flat plane objects with respect to one other, as for the case of an electrical component to be mounted to a circuit board. Here, a circuit board 199 has an array of contact points 211, but it also has protruding features 205 and 206. These can be solder bumps or posts. Electronics component 200 has an array of electrical contacts 210 that is to be connected to corresponding contacts 211 on printed circuit board 199. In order to facilitate the relative position and alignment between electronics component 200 and printed circuit board 199, the electronics component is provided with protrusions 201, 202, 203, and 204 in one corner, and protrusions 201', 202', 203', and 204' in another corner. It would also be possible to have two sets of three protrusions, but here it was desired to keep the same basic pattern. When the electronics component 200 is flipped over and placed on the printed circuit board 199, protrusions 201, 202, 203, and 204 effectively surround protrusion 205 on the printed circuit board. In addition, protrusions 201', 202'. 203', and 204' surround protrusion 206. This particular embodiment is overconstrained, but enough tolerance is easily built into the system to obtain sufficient alignment; and when solder balls are used, they will melt and stay aligned to their respective contacts by the effect of surface tension. To obtain additional functionality, the alignment features can also be ground connections for the component.

FIGS. 8a and 8b represent one such particular alignment principle. The mold kinematic coupling grooves may be molded into the electronics component package, such as three grooves, or three slots, which could engage ball-type features on the printed circuit board, or vice versa. The unique feature, however, as with the printed circuit board layers mentioned above, is the use of essentially kinematic features built into the printed circuit board layers, the printed circuit board itself, and the electronics components, also. Thus, from a coarse (board level) to fine (component level) scale, all element positions are determined by physical features.

Further modifications of the invention will also occur to persons skilled in the art, and all such are deemed to fall within the spirit and scope of the invention as defined by the appended claims.

What is claimed is:

1. A system for kinematically position planar surfaces such as sheets having, in combination, a planar mount for resting the surfaces thereupon; each surface having a plurality of openings spaced along and near edges thereof; the planar mount being provided with a plurality of protrusions corresponding, located and spaced similarly to the openings and of less cross-dimensions than that between the walls bounding the openings such that, as the surface is mounted on the planar mount, the protrusions thereof are loosely received within the corresponding surface openings; the mounted surface being subject to an applied preload force having a component alone the plane of the surface to cause the protrusions to engage and contact points of the walls of the corresponding openings, uniquely to define the planar position and orientation of the surface upon the mount and thus achieve a high degree of repeatability and in which the openings are slots and the potrusions are posts and in which three slots and three corresponding posts are provided located and oriented such that a preload force component applied parallel to said plane creates maximum self-centering and location repeatability, and in which two slots are inclined to the applied preload force component and the third slot is one of parallel to and orthogonal to said force component.

2. The system as claimed in claim 1, wherein the planar mount is inclined, and the preload force is provided by gravity.

3. The system as claimed in claim 1 wherein the slots are cut near the edges of the surface to provide a kinematically stable condition, and where extensions of the contact force vectors create a closed triangle.

4. The system as claimed in claim 3 wherein the slots are positioned substantially to hang the surface in tension without creating any buckling or wrinkling in the surface.

5. The system as claimed in claim 1 and in which two slots serve to hang the surface upon the mount and the third slot serves to resist rotational or pivoting movement.

6. The system as claimed in claim 1 wherein the sheet comprises printed circuit board components.

* * * * *